US005789703A

United States Patent [19]

Choi

[11] Patent Number: 5,789,703

[45] Date of Patent: Aug. 4, 1998

[54] DEVICE FOR COUPLING FOCUS UNIT OF FLY BACK TRANSFORMER

[75] Inventor: Dae Sung Choi, Kyongki-Do, Rep. of Korea

[73] Assignee: Samsung Electro-Mechanics Co., Ltd., Kyongki-do, Rep. of Korea

[21] Appl. No.: 888,597

[22] Filed: Jul. 7, 1997

Related U.S. Application Data

[63] Continuation of Ser. No. 542,589, Oct. 13, 1995, abandoned.

[51] Int. Cl.[6] .................... H01L 23/28

[52] U.S. Cl. .................... 174/50.62; 174/52.2; 174/255; 336/96

[58] Field of Search .................... 174/50.52, 50.54, 174/50.62, 52.1, 52.2, 52.3, 255, 259; 336/96, 98

[56] References Cited

U.S. PATENT DOCUMENTS

| | | | |
|---|---|---|---|
| 3,879,726 | 4/1975 | Sweany | 174/50.52 X |
| 4,195,201 | 3/1980 | Gryl, Jr. et al. | 336/96 X |
| 5,153,791 | 10/1992 | Mizukami et al. | 174/52.1 X |
| 5,412,159 | 5/1995 | Wiltgen et al. | 174/255 X |
| 5,546,280 | 8/1996 | Hasebe et al. | 361/752 |

FOREIGN PATENT DOCUMENTS

| | | | |
|---|---|---|---|
| 1-36377 | 3/1989 | Japan . | |
| 6252573 | 9/1994 | Japan | 174/52.1 X |

*Primary Examiner*—Kristine L. Kincaid
*Assistant Examiner*—Dean A. Reichard
*Attorney, Agent, or Firm*—Lowe, Price, LeBlanc & Becker

[57] ABSTRACT

A device for coupling a fly back transformer (FBT) focus unit is disclosed. A protecting wall is installed on the coupling portion of the FBT case in such a manner that the protecting wall should be positioned adjacently to and should keep a gap toward the ceramic circuit board which is attached to the back face of the focus unit in an exposed state. That is, a protecting wall (6) is formed integrally with the FBT case (5) and on the coupling portion 4 for the focus unit (2) and adjacently to the ceramic circuit board (1), so that a tiny space (S) would be formed. A small amount of a hard insulating resin (3) is filled into the tiny space S between the protecting wall and the ceramic circuit board (1), and the resin (3) is made to be cured, so that internal coils of the FBT case (5) would be insulated. Therefore, an injection of a soft insulating resin for preventing a damage to the ceramic circuit board becomes needless. Consequently, the workability is improved, and at the same time, the focus unit is firmly coupled to the FBT case without damaging the ceramic circuit board of the focus unit. Further, a small amount of the hard insulating resin is filled and cured, and therefore, the focus unit is firmly coupled to the FBT case.

5 Claims, 4 Drawing Sheets

DEVICE FOR COUPLING FOCUS UNIT OF FLY BACK TRANSFORMER

This application is a continuation of application Ser. No. 08/542.589 filed Oct. 13, 1995, now abandoned

FIELD OF THE INVENTION

The present invention relates to a fly back transformer (to be called "FBT" below) which is a high voltage generating apparatus for supplying a high voltage to a cathode ray tube of televisions or other monitors. Particularly, the present invention relates to a device for coupling a focus unit of the FBT, in which a focus unit with a ceramic circuit board exposed is securely fixed on a side of a FBT case, the FBT case accommodating a low voltage bobbin and a high voltage bobbin coupled together.

More specifically, the present invention relates to a device for coupling a focus unit of the FBT, in which a protecting wall formed integrally with the FBT case is installed on a focus unit coupling portion positioned on a side of the FBT case, an exposed ceramic circuit board of the back of the focus unit is installed adjacently thereto, and a small amount of an insulating resin is filled between the protecting wall and the ceramic circuit board of the back of the focus unit so as to insulate the FBT. Consequently, when coupling the focus unit to a side of the FBT case, a separate process of filling and curing a soft resin for preventing damage to the ceramic circuit board can be skipped, but at the same time, the focus unit and the ceramic circuit board can be firmly fixed. Further, owing to the filling of the hard resin only in a small amount, a damage to the ceramic circuit board of the focus unit can be prevented.

DESCRIPTION OF THE PRIOR ART

Generally, the method of securing a focus unit to a side of an FBT case accommodating a high voltage bobbin and a low voltage bobbin combined together is carried out in the following manner. That is, as shown in FIG. 1, a soft insulating resin 13 is injected to a ceramic circuit board of a focus unit 12, and the resin is cured so as to eliminate exposure. The back side of the focus unit 12 is attached on a coupling portion 14 of an FBT case. A hard insulating resin 16 is filled into the interior of the FBT case 15 for insulating a high voltage bobbin and a low voltage bobbin, thereby forming an integral molding.

The focus unit 12 which is coupled in the above described manner undergoes the following process. That is, after coupling the ceramic circuit board to the coupling portion 14 of the FBT case 15, a soft epoxy resin 13 is separately injected to the ceramic circuit board 11 and cured, so that damage to the circuit board due to shrinking and curing of the hard insulating resin (16) can be prevented.

However, during the coupling of the focus unit 12 to a side of the FBT case 15, it is very troublesome to inject and cure the soft insulating resin 13 to the ceramic circuit board 11. Further, after the curing of the soft insulating resin, and after securing the focus unit 12 to the FBT case 15, the hard insulating resin is injected again to make it cured, and therefore, the manufacturing time is extended.

Further, after coupling the focus unit 12 to the FBT case 15, and during the curing of the hard insulating resin 16, the height of the focus unit 12 on the FBT case 15 is increased as much as the height of the cured soft epoxy resin 13, with the result that the overall size of the FBT is increased.

Meanwhile, recently, a proposal has been made such that a separating wall is installed on a side of the FBT case, and the focus unit is installed thereon, so as to protect the ceramic circuit board of the focus unit.

That is, Japanese Utility Model publication NO. Hei-1-36377 discloses a device for coupling a focus unit of a FBT. That is, as shown in FIG. 2, this device is constituted as follows. That is, a separating wall 24 having an elongate cut-off portion 23 is installed on a coupling portion 22 of an FBT case 21. A ceramic circuit board 25 and a focus unit 26 are installed on the coupling portion 22, and a hard insulating resin 27 is filled into the interior of the FBT case 21 and to the back side of the focus unit 26 so as for the resin to be cured into an integral molding.

However, in the focus unit 26 which is installed to the coupling portion 22 of the FBT case 21, the thickness of the insulating resin disposed between the ceramic circuit board 25 and the separating wall 24 is too large as shown in FIG. 2B. Further, a large amount of the insulating resin is introduced through the elongate cut-off portion 23, with the result that the ceramic circuit board 25 is liable to be damaged due to the shrinking of the insulating resin.

Further, as shown in FIG. 3, there is another proposal. According to this proposal, a hard insulating resin 37 is filled into an FBT case 31, and is made to be cured. Then, a plurality of terminal inserting holes 33 are formed on a coupling portion 32 of the FBT case 31, and then, a ceramic circuit board 34 is installed. Then terminal portions 36 of a focus unit 35 on which an insulating resin is molded are inserted into the terminal inserting holes, thereby coupling the focus unit 35 to the coupling portion 32 of the FBT case 31. However, in this case, the coupling strength between the FBT case 31 and the focus unit 35 are extremely weak, and therefore, the focus unit 35 is apt to be easily detached.

SUMMARY OF THE INVENTION

The present invention is intended to overcome the above described disadvantages of the conventional techniques.

Therefore it is an object of the present invention to provide a device for coupling an FBT focus unit, in which a protecting wall for protecting a ceramic circuit board is installed on a coupling portion of an FBT case (on which the focus unit is installed with the ceramic circuit board exposed), the protecting wall and the ceramic circuit board are closely positioned to each other so as to form a tiny space therebetween, and an insulating resin is filled into the tiny space so as to minimize the shrinking during the curing, whereby an injection of a soft insulating resin to the back side of the focus unit for preventing the damage of the ceramic circuit board is omitted, but the ceramic circuit board of the focus unit can be firmly coupled to the coupling portion of the FBT case without being damaged.

It is another object of the present invention to provide a device for coupling an FBT focus unit, in which the protecting wall is provided with a resin passing hole, so that, during the coupling of the focus unit to the coupling portion of the FBT case, damage to the ceramic circuit board can be prevented during the curing and shrinking of the hard insulating resin.

In achieving the above object, the device for coupling an FBT focus unit according to the present invention is characterized in that: a protecting wall is formed integrally with an FBT case and on a focus unit coupling portion of the FBT case adjacently to an exposed ceramic circuit board of the back side of a focus unit so as to form a tiny space; and a hard insulating resin is injected into the tiny space between the protecting wall and the ceramic circuit board so as to insulate internal coils of the FBT case.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
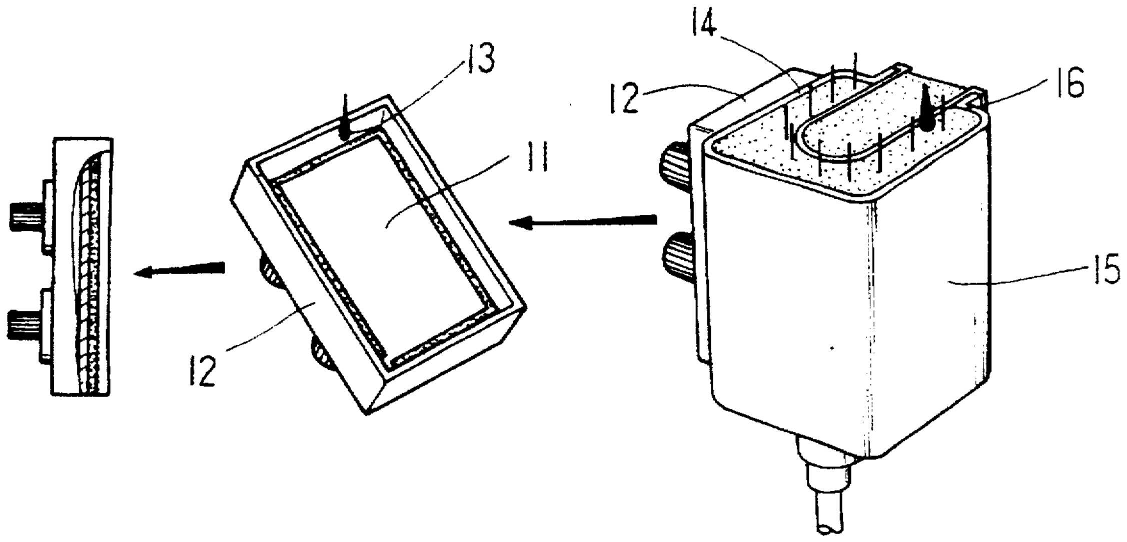
FIG. 1 PRIOR ART
FIG. 1 illustrates the general coupling state of an FBT focus unit.
Figure 3:
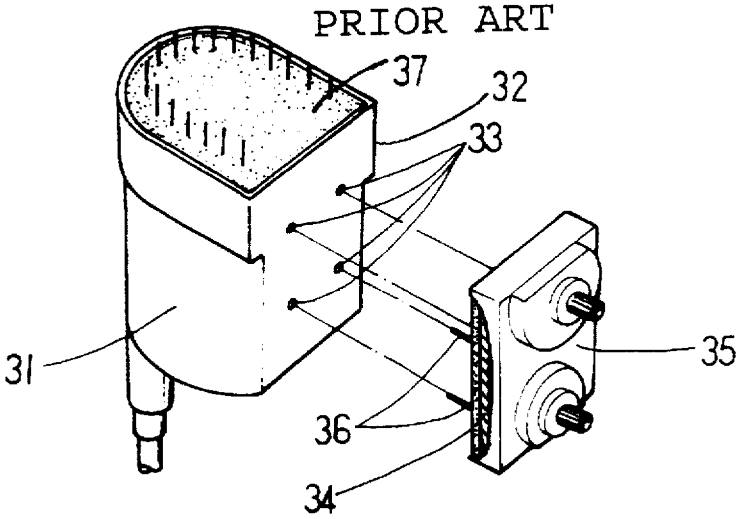
FIG. 3 PRIOR ART
FIG. 3 illustrates another conventional form of the coupling of an FBT focus unit.
Figure 2:
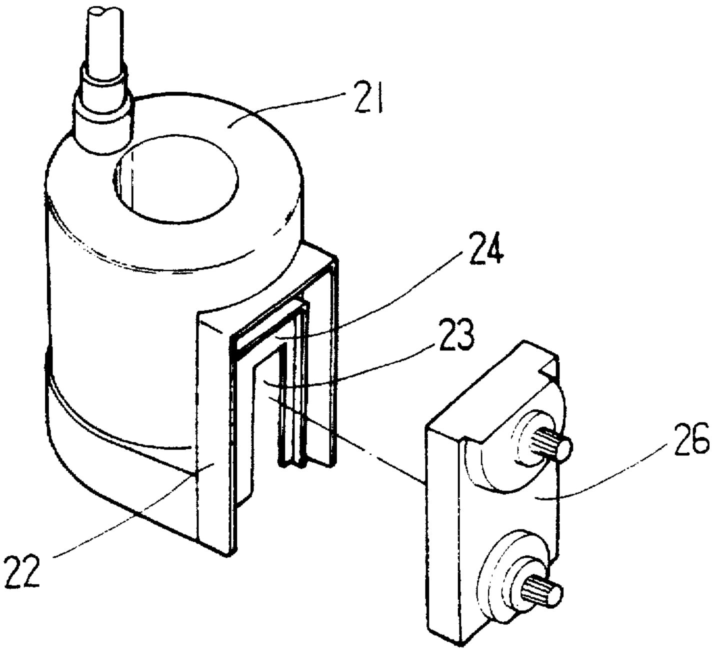
FIG. 2 (A) PRIOR ART
FIG. 2 illustrates the coupling of a conventional FBT focus unit in exploded perspective (view A), and in exploded cross-section (view B)
Figure 2:
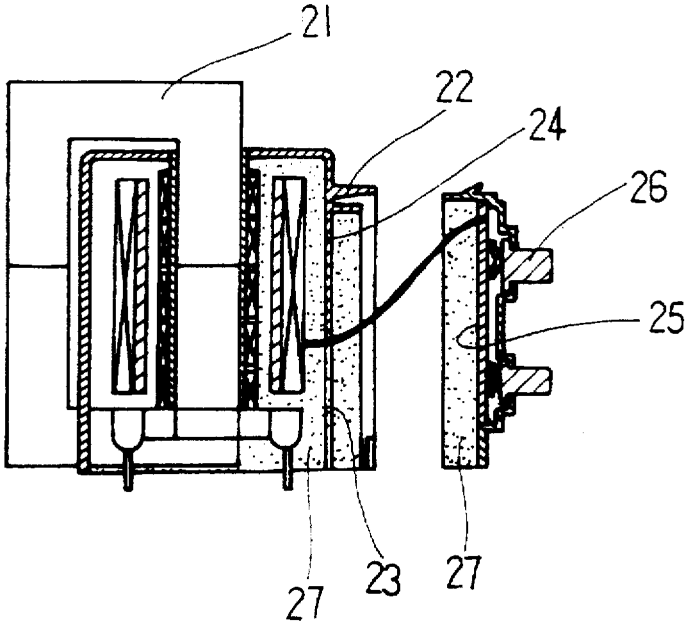
FIG. 2 (B) PRIOR ART
Figure 4:
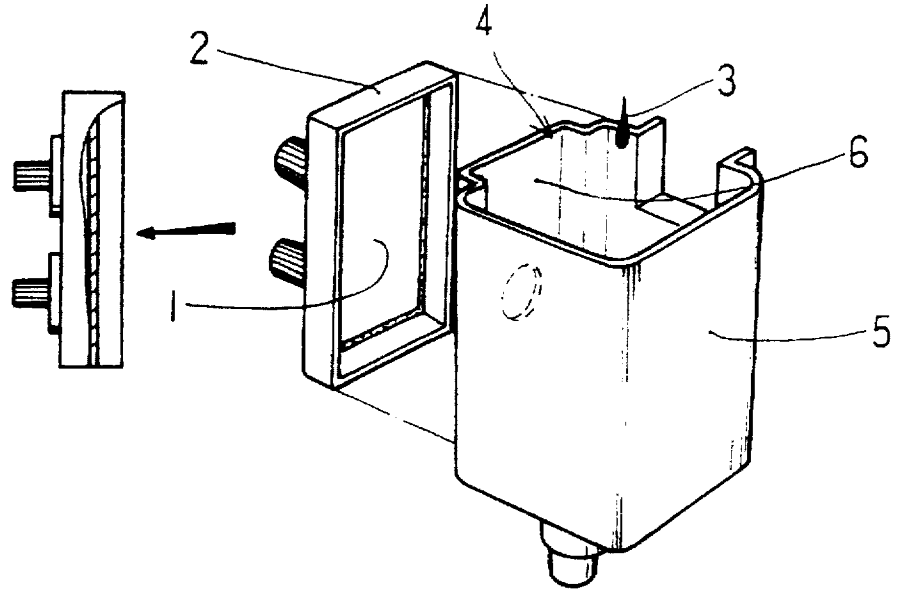
FIG. 4 is a schematic perspective view showing the coupling of the FBT focus unit according to the present invention.

FIG. 4 is a schematic perspective view showing the coupling of the FBT focus unit according to the present invention. As shown in this drawing, a focus unit 2, on the back of which a ceramic circuit board 1 is installed, is attached to a coupling portion 4 which is formed on a side of an FBT case 5. Then a hard insulating resin 3 is filled and cured, thereby coupling the focus unit 2.

Further, a protecting wall 6 is injection molded integrally with the FBT case 5 and on the coupling portion 4 for the focus unit 2 and adjacently to the ceramic circuit board 1, so that a tiny space S would be formed. A small amount of a hard insulating resin 3 is filled into the tiny space S between the protecting wall and the ceramic circuit board 1, and the resin 3 is made to be cured, so that internal coils of the FBT case 5 would be insulated.

The protecting wall 6 which is installed on the coupling portion of the FBT case 5 is provided with a resin passing hole 8 or a slot 9 through which the hard insulating resin passes.

The device of the present invention constituted as described above will now be described as to its function and effects.

Figure 5:
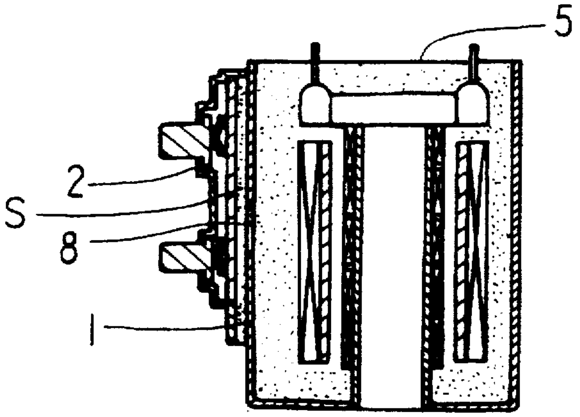
FIG. 5 is a sectional view showing the coupled state of the FBT focus unit according to the present invention.
Figure 6:
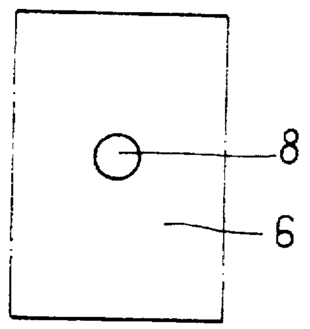
FIG. 6 illustrates in views A and B two possible protective walls, each of which could be installed on the coupling portion of the FBT case according to the present invention.
Figure 6:
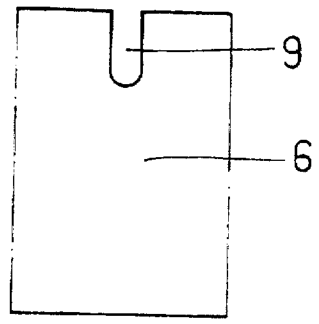

As shown in FIGS. 4 to 6, the FBT case 5 accommodates a high voltage bobbin and a low voltage bobbin, and the focus unit 2 is secured to the coupling portion 4 on a side of the FBT case 5. In this case, the ceramic circuit board 1 which is positioned on the back face of the focus unit 2 is made to face toward the coupling portion 4, and in this state, the focus unit 2 is assembled to the coupling portion 4 of the FBT case 5.

Meanwhile, the protecting wall 6 which is formed integrally with the FBT case and formed simultaneously with the FBT case 5 is formed on the coupling portion 4 of the FBT case 5. Thus the protecting wall 6 is positioned adjacently to the ceramic circuit board 1 of the focus unit 2 so as to keep a small distance from the focus unit 2, thereby isolating the ceramic circuit board 1.

A minimum space is provided between the protecting wall 6 of the coupling portion 4 of the FBT case 5 and the ceramic circuit board 1 of the focus unit 2, so that they would be separated across the minimum space. That is, a tiny space S is formed between the protecting wall 6 and the ceramic circuit board 1, and a hard insulating resin is filled into the space S. Under this condition, the stress caused by the shrinking of the cured resin is minimized by the tininess of the space S, thereby preventing damage to the ceramic circuit board 1.

Then as shown in FIGS. 5 and 6, in a state with the protecting wall 6 of the coupling portion 4 and the ceramic circuit board 1 of the focus unit 2 adjacently installed, a hard insulating resin 3 is injected for insulating a high voltage coil of a bobbin (not shown) within the FBT case 5. During this filling, the hard insulating resin 3 is not directly filled to the ceramic circuit board 1, but only a small amount of the hard insulating resin 3 intrudes through the resin passing hole 8 or the slot 9 of the protecting wall 6.

Therefore, after filling the hard insulating resin 3 into the FBT case 5, when the resin 3 is cured, the resin 3 does not affect the ceramic circuit board 1 owing to the fact that the resin 3 intruded in small amounts through the resin passing hole 8 or the slot 9 of the protecting wall 6 into the tiny space S between the ceramic circuit board 1 and the protecting wall 6. Consequently, the ceramic circuit board 1 of the focus unit 2 is safely protected, and is firmly coupled with the FBT case 5 in an insulated state.

According to the present invention as described above, a protecting wall is installed on the coupling portion of the FBT case in such a manner that the protecting wall should be positioned adjacently to and should keep a gap toward the ceramic circuit board which is attached to the back face of the focus unit in an exposed state. Therefore, an injection of a soft insulating resin for preventing damage to the ceramic circuit board becomes unnecessary. Consequently, the workability is improved, and at the same time, the focus unit is firmly coupled to the FBT case without damaging the ceramic circuit board of the focus unit. Further, a small amount of the hard insulating resin is filled and cured, and therefore, the focus unit is firmly coupled to the FBT case.

In the above, the present invention was described based on the specific preferred embodiment as shown in the drawings, but those ordinarily skilled in the art will understand that various changes and modifications can be added without departing from the scope of the present invention.

What is claimed is:

1. A fly back transformer (FBT) comprising:

an FBT case including a high voltage generating apparatus and having a coupling portion forming a protective wall;

a focus unit having a front and a back, and being attached to said coupling portion of said FBT case;

a circuit board having a thickness attached on the back of said focus unit and a hard insulating resin cured to couple said focus unit to said FBT case;

wherein a recess having a thickness is defined between said circuit board and said protective wall, the thickness of said circuit board being approximately equal to said thickness of said recess whereby shrinkage of said insulating resin does not affect said circuit board.

2. The device as claimed in claim 1, wherein said protecting wall installed on said coupling portion of said FBT case is provided with a resin passing hole for passing said hard insulating resin.

3. The device as claimed in claim 1, wherein said protecting wall installed on said coupling portion of said FBT case is provided with a slot for passing said hard insulating resin.

4. The device as claimed in claim 1, wherein said protective wall installed on said coupling portion of said FBT case is injection-molded integrally with said FBT case, and is composed of a material which is the same as that of said FBT case.

5. The coupling device of claim 1, wherein said protective wall includes at least one opening sized such that said protective wall prevents damage to the circuit board due to shrinking and curing of the hard insulating resin.

* * * * *